US006790687B2

(12) United States Patent
Yoshimura

(10) Patent No.: US 6,790,687 B2
(45) Date of Patent: Sep. 14, 2004

(54) SUBSTRATE PROCESSING APPARATUS AND SEMICONDUCTOR DEVICE PRODUCING METHOD

(75) Inventor: Tomohiro Yoshimura, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/375,357

(22) Filed: Feb. 28, 2003

(65) Prior Publication Data

US 2003/0230562 A1 Dec. 18, 2003

(30) Foreign Application Priority Data

Mar. 27, 2002 (JP) ........................................ 2002-087924

(51) Int. Cl.[7] .............................................. H01L 21/66
(52) U.S. Cl. .......................................... 438/14; 438/15
(58) Field of Search ..................................... 438/14, 15

(56) References Cited

U.S. PATENT DOCUMENTS

| | | | | |
|---|---|---|---|---|
| 5,455,082 A | * | 10/1995 | Saito et al. ................. | 427/542 |
| 5,980,767 A | * | 11/1999 | Koshimizu et al. .......... | 216/60 |
| 6,007,635 A | | 12/1999 | Mahawili | |
| 6,090,212 A | | 7/2000 | Mahawili | |
| 6,515,261 B1 | * | 2/2003 | Smargiassi et al. ......... | 219/390 |
| 6,566,630 B2 | * | 5/2003 | Kitamura .................... | 219/390 |
| 6,630,991 B2 | * | 10/2003 | Kitamura et al. ............. | 356/43 |

* cited by examiner

Primary Examiner—John F. Niebling
Assistant Examiner—Olivia T. Luk
(74) Attorney, Agent, or Firm—Birch, Stewart, Kolasch & Birch, LLP

(57) ABSTRACT

A substrate processing apparatus includes a processing chamber which processes a substrate; a substrate supporting body which supports the substrate in the processing chamber; a heating member which heats the substrate and which is disposed on an opposite side from the substrate with respect to the substrate supporting body; a substrate temperature detecting device provided at a position opposed to a surface of the substrate; and a light-shielding member which shields stray light from the heating member and which is disposed around the substrate, wherein the light-shielding member has quartz members and an opaque member sandwiched between the quartz members.

7 Claims, 2 Drawing Sheets

SUBSTRATE PROCESSING APPARATUS AND SEMICONDUCTOR DEVICE PRODUCING METHOD

BACKGROUND OF THE INVENTION

1. Field of the Invention

The present invention relates to a substrate processing apparatus and a semiconductor device producing method, and more particularly, to a substrate processing apparatus for sensing radiation light emitted from a silicon substrate by a radiation thermometer to control a temperature and a semiconductor device producing method using the substrate processing apparatus.

2. Description of the Related Art

According to a conventional apparatus, a radiation thermometer disposed on an upper portion of a platform senses radiation light emitted from a substrate on the platform, thereby controlling a temperature, and a quartz platform is used as the platform.

In the quartz platform, a quartz is circularly hollowed, a coating is applied to a surface of such a quartz, and stray light of a lamp from peripheries of the substrate is cut off by the coating. In such a conventional structure, while repeating process processing (temperature increasing and decreasing cycle), the surface coating is peeled off due to difference of coefficient of thermal expansion between the quartz and the surface coating. A fragment of the surface coating becomes particles adhering on the substrate, and deteriorates device characteristics and exerts an adverse influence upon yield. According to this apparatus, since the radiation thermometer senses radiation light emitted by the substrate to control a temperature, there is an adverse possibility that stray light of a lamp leaking from a portion of quartz where the coating is peeled off exerts an adverse influence upon the temperature control.

SUMMARY OF THE INVENTION

Thereupon, it is a main object of the present invention to solve the peeling of the surface coating which is a problem of the conventional technique, and to provide a substrate processing apparatus having a quartz platform (substrate supporting stage) capable of restraining or preventing particles from being induced, and capable of restraining or preventing the particles from exerting an influence on temperature control.

According to a first aspect of the present invention, there is provided a substrate processing apparatus, comprising:

a processing chamber which processes a substrate;

a substrate supporting body which supports the substrate in the processing chamber;

a heating member which heats the substrate and which is disposed on an opposite side from the substrate with respect to the substrate supporting body;

a substrate temperature detecting device provided at a position opposed to a surface of the substrate; and a light-shielding member which shields stray light from the heating member and which is disposed around the substrate, wherein the light-shielding member has quartz members and an opaque member sandwiched between the quartz members.

According to a second aspect of the present invention, there is provided a semiconductor device producing method, comprising:

mounting a substrate on a substrate supporting body disposed in a processing chamber;

heating the substrate by a heating member disposed on a first main surface side of the substrate;

monitoring a temperature of the substrate by a substrate temperature detecting device provided at a side of a second main surface of the substrate opposed to the first main surface of the substrate; and shielding stray light from the heating member to the substrate temperature detecting device by a light-shielding member which includes quartz members and an opaque member sandwiched between the quartz members and which is disposed around the substrate.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
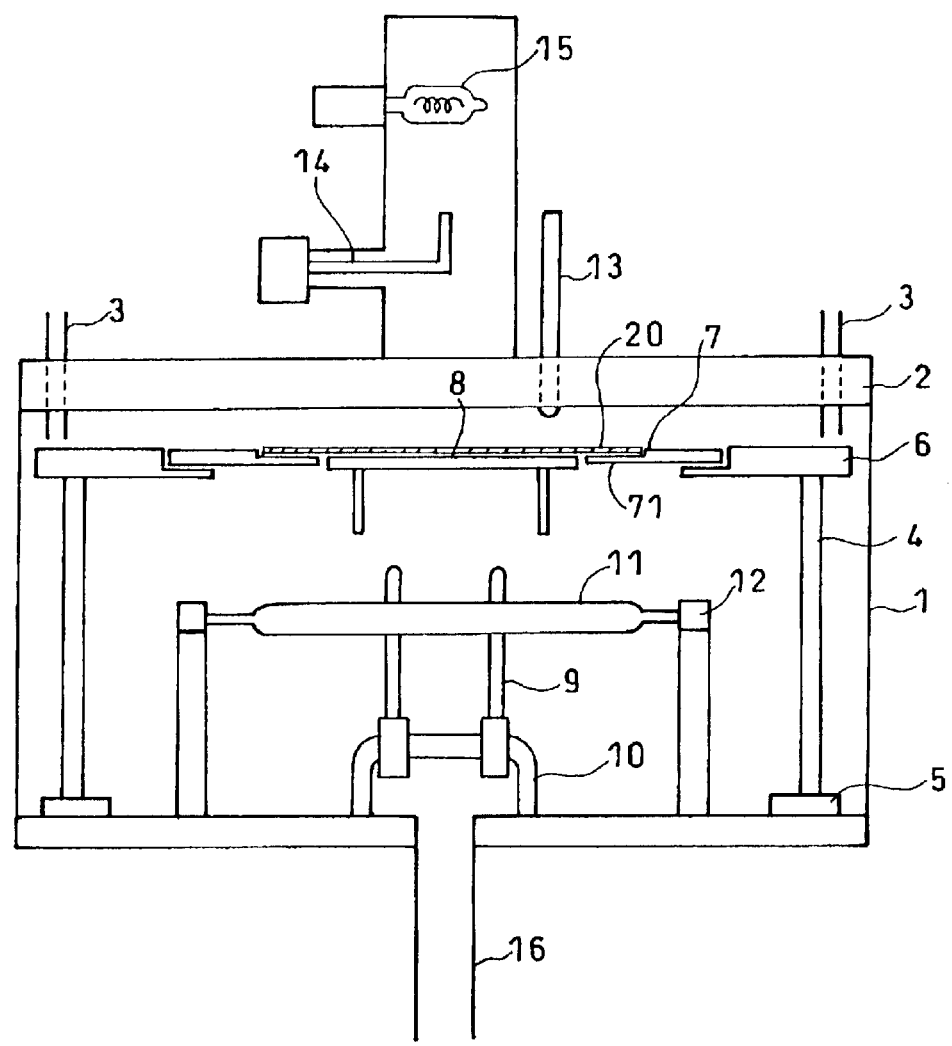
FIG. 1 is a schematic longitudinal sectional view of a semiconductor wafer processing apparatus according to one embodiment of the present invention and a conventional art.

Next, an embodiment of the present invention will be explained with reference to FIGS. 1 to 4.

A semiconductor wafer processing apparatus of this embodiment comprises a substrate processing chamber 1, a vertically movable substrate processing chamber lid 2, introducing pipes 3 for substrate processing gas and for carrier gas charging gas, quartz turrets 4 used for supporting quartz platforms 6 and 7, rotating mechanisms (bearings) 5, the quartz outer platform 6 placed on the quartz turrets 4 for supporting the quartz inner platform 7, the quartz inner platform 7 placed on the quartz outer platform 6 for supporting a quartz plug 8, the quartz plug 8 placed on the quartz inner platform 7 and capable of moving vertically by quartz wafer lift pins 9, the quartz wafer lift pins 9 used when a wafer is loaded and unloaded, a wafer-vertically moving mechanism 10 used when a wafer is loaded and unloaded, a rod-like halogen lamp 11 used for heating a substrate, lamp electrodes 12, a radiation thermometer 13 used when radiation light of a substrate which is being processed is sensed, a reflection coefficient measuring lamp 15, an emissivity measuring probe 14 used for lighting the reflection coefficient measuring lamp 15 and measuring its radiation strength and detecting a measurement value of reflection strength from a wafer 20 when the lamp 15 is lit, an exhausting pipe 16 used when a substrate processing chamber is exhausted (evacuated), and a guide pin 81 for preventing the quartz plug from being deviated in position.

One example of process of the semiconductor wafer processing as one step of producing steps of a semiconductor device will be explained below with reference to FIGS.

1 and 2 using the semiconductor wafer processing apparatus of the embodiment.

Since this semiconductor wafer processing apparatus employs a vacuum transfer system, a substrate (semiconductor wafer) 20 is received and delivered in a vacuum between all modules. When the substrate processing chamber 1 is in a vacuum state and the quartz plug 8 is in an up state (substrate receiving and delivering position) by the wafer lift pins 9 and the wafer-vertically moving mechanism 10, an atmosphere isolation valve which is not shown in FIG. 1 is opened, the substrate 20 is inserted into the substrate processing chamber 1, and after the inserting operation is completed, the atmosphere isolation valve is closed. Then, the quartz plug 8 on which the substrate 20 is placed by the wafer-vertically moving mechanism 10 is moved into a down state (substrate processing position), and rotation is started by the rotating mechanisms 5. At that time, not only the quartz plug 8 on which the substrate 20 is placed, but also the quartz turrets 4 which are placed on the rotating mechanisms 5, the quartz outer platform 6 and the quartz inner platform 7 are rotated. Thereafter, emissivity is measured by the emissivity measuring probe 14 and the reflection coefficient measuring lamp 15. Since the emissivity is different depending upon kinds of wafer, an actual temperature is calculated by correcting the measured value using the emissivity.

To obtain the emissivity of the substrate (semiconductor wafer) 20, first, in a state in which the reflection coefficient measuring lamp 15 is lit, radiation strength A of the reflection coefficient measuring lamp 15 is measured such that a tip end of the emissivity measuring probe 14 is directed toward the reflection coefficient measuring lamp 15 existing directly above the emissivity measuring probe 14. Next, in a state in which the reflection coefficient measuring lamp 15 is lit, radiation strength B from the substrate (semiconductor wafer) 20 is measured such that the tip end of the emissivity measuring probe 14 is directed to the substrate (semiconductor wafer) 20 existing directly below the emissivity measuring probe 14. Then, in a state in which the reflection coefficient measuring lamp 15 is lit, radiation strength C from the substrate (semiconductor wafer) 20 is measured. Since the radiation strength C from the substrate (semiconductor wafer) 20 is included in the radiation strength B from the substrate (semiconductor wafer) 20 in the state in which the reflection coefficient measuring lamp 15 is lit, (C-B) is strength of reflection light of light from the reflection coefficient measuring lamp 15 reflected by the substrate 20 and as a result, a reflection coefficient α of light from the reflection coefficient measuring lamp 15 reflected by the substrate (semiconductor wafer) 20 is expressed as follows:

$$\alpha = (C-B)/A.$$

A relation between reflection coefficient, absorption index and transmittance of light of the reflection coefficient measuring lamp 15 with respect to the substrate 20 is expressed as follows:

Reflection coefficient+absorption index+transmittance=1.

The light of the reflection coefficient measuring lamp 15 is white light having a maximum strength of 0.9 μm. Since the light of 0.9 μm does not pass through the semiconductor silicon wafer 15, the transmittance is 0.

Therefore, reflection coefficient+absorption index=1, and since the absorption index and emissivity on a surface of an arbitrary material are equal to each other, the following equation is established:

Emissivity=1-a reflection coefficient=1-(C-B)/A

If a measured value measured by the radiation thermometer 13 is corrected with the emissivity obtained in this manner, it is possible to obtain the actual temperature of the substrate (semiconductor wafer) 20.

The rod-like halogen lamp 11 is lit to increase a temperature and adjust a pressure, and when process conditions are satisfied, a substrate processing event is started. As main processing, film-forming processing for forming an oxide film using $O_2$ gas and $N_2$ gas, anneal processing and the like are carried out. The radiation thermometer 13 is used for monitoring a substrate temperature during temperature increasing, and correction is carried out in the above-described manner to obtain an actual temperature of the substrate (semiconductor wafer) 20. After the processing, the substrate processing chamber 1 is evacuated and after the evacuation is completed, if the wafer-vertically moving mechanism 10 assumes the up position, the atmosphere isolation valve (not shown) is opened, and if the unloading operation of the substrate (semiconductor wafer) 20 from the substrate processing chamber 1 is completed, the atmosphere isolation valve is closed and the processing is completed.

Figure 3:
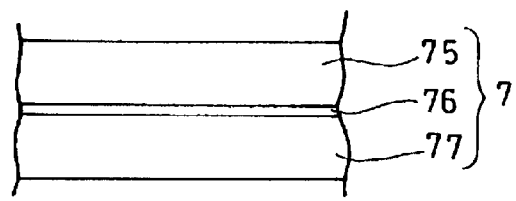
FIG. 3 is a schematic longitudinal sectional view of a light-shielding member of a semiconductor wafer processing apparatus according to one embodiment of the present invention.
Figure 4:
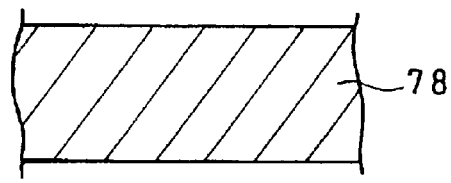
FIG. 4 is a schematic longitudinal sectional view of a light-shielding member of a semiconductor wafer processing apparatus according to another embodiment of the present invention.

When light-shield coatings are applied to surfaces of the quartz platforms 6 and 7, if the above-described processing is repeated, the coatings are peeled off. A reason why the surface coatings of the quartz platforms 6 and 7 are peeled off is a difference in coefficient of thermal expansion between the quartz itself and the surface coating. Thereupon, as countermeasures against this problem, the quartz platforms 6 and 7 are formed into such a structure that a coating 76 is sandwiched between quartz 15 and quartz 17 as shown in FIG. 3. With this structure, since the coating 76 is not peeled off, it is possible to restrain particles from being generated, and to keep shielding stray light from a periphery of the substrate. Preferable coating materials are SiC, Si and the like which can shield the stray light. It is also effective to change the quality of material of the quartz to colored quartz (opaque quartz) having low transmittance with respect to lamp light (see FIG. 4). With this structure, it is also possible to omit the coating itself, and the same effect as that when the coating is sandwiched between quartz and quartz can be obtained.

Figure 2:
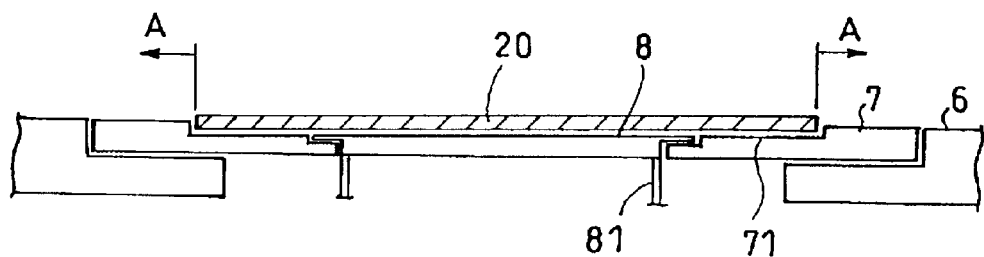
FIG. 2 is a partially enlarged longitudinal sectional view of FIG. 1.

As shown in FIG. 2, the quartz inner platform 7 is provided at its inner side with a substrate-placing portion 71, and a peripheral portion of the substrate (semiconductor wafer) 20 is placed on the substrate-placing portion 71. The structure in which the coating 76 is sandwiched between the quartz 15 and quartz 17 is provided in portions (in a region A in FIG. 2) of the quartz platforms 6 and 7 other than a region thereof where the substrate (semiconductor wafer) 20 is placed. This is because that the entire surface of the substrate (semiconductor wafer) 20 receives the heat radiation from the rod-like halogen lamp 11, and stray light in a region other than a region when the substrate 20 is placed is effectively shielded.

Although the structure in which the coating 76 is sandwiched between the quartz 75 and quartz 77 is explained in the above embodiment, a plate (e.g., SiC plate or the like) having material capable of shielding stray light of the lamp may be sandwiched between the quartz and quartz instead of the coating 76.

The quartz plug 8 is provided at its lower portion with three guide pins 81 for preventing positional deviation of the quartz platform which are separated through 120° from one another. With the guide pins, when the quartz plug 8 is vertically moved, the quartz plug 8 is prevented from being deviated in position between itself and the quartz inner platform 7.

In this embodiment, since the peeling of the surface coating is eliminated, at least particles are restrained from being generated. Therefore, particles adhering to the substrate are reduced, it is possible to prevent the device characteristics from being deteriorated, and to eliminate the influence on the yield.

Further, since the stray light of the lamp is eliminated, a temperature is controlled smoothly, and a substrate can be processed without exerting an influence on process data, and the throughput can be enhanced.

The entire disclosure of Japanese Patent Application No. 2002-087924 filed on Mar. 27, 2002 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A substrate processing apparatus, comprising:
   a processing chamber which processes a substrate;
   a substrate supporting body which supports said substrate in said processing chamber;
   a heating member which heats said substrate and which is disposed on an opposite side from said substrate with respect to said substrate supporting body;
   a substrate temperature detecting device provided at a position opposed to a surface of said substrate; and
   a light-shielding member which shields stray light from said heating member and which is disposed around said substrate, wherein
   said light-shielding member has quartz members and an opaque member sandwiched between said quartz members.

2. A substrate processing apparatus as recited in claim 1, wherein
   said substrate supporting body comprises said quartz members.

3. A substrate processing apparatus as recited in claim 1, wherein
   said opaque member is a coating of a material selected from the group consisting of SiC and Si.

4. A substrate processing apparatus as recited in claim 1, wherein
   said opaque member is a SiC plate.

5. A substrate processing apparatus as recited in claim 1, wherein
   said light-shielding member is provided at a portion of said substrate supporting body other than a region thereof where said substrate is placed.

6. A semiconductor device producing method, comprising producing a semiconductor device using a substrate processing apparatus as recited in claim 1.

7. A semiconductor device producing method, comprising:
   mounting a substrate on a substrate supporting body disposed in a processing chamber;
   heating said substrate by a heating member disposed on a first main surface side of said substrate;
   monitoring a temperature of said substrate by a substrate temperature detecting device provided at a side of a second main surface of said substrate opposed to said first main surface of said substrate; and
   shielding stray light from said heating member to said substrate temperature detecting device by a light-shielding member which includes quartz members and an opaque member sandwiched between said quartz members and which is disposed around said substrate.

* * * * *